(12) United States Patent
LaBerge

(10) Patent No.: US 7,379,382 B2
(45) Date of Patent: May 27, 2008

(54) SYSTEM AND METHOD FOR CONTROLLING TIMING OF OUTPUT SIGNALS

(75) Inventor: Paul A. LaBerge, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 232 days.

(21) Appl. No.: 11/262,275

(22) Filed: Oct. 28, 2005

(65) Prior Publication Data

US 2007/0097778 A1 May 3, 2007

(51) Int. Cl.
*G11C 8/00* (2006.01)

(52) U.S. Cl. ............. 365/233; 365/189.05; 365/230.08

(58) Field of Classification Search ................ 365/233, 365/189.05, 230.08
See application file for complete search history.

(56) References Cited

U.S. PATENT DOCUMENTS

| | | | | |
|---|---|---|---|---|
| 6,002,279 A | 12/1999 | Evans et al. | ................ | 327/144 |
| 6,340,909 B1 | 1/2002 | Zerbe et al. | ................ | 327/246 |
| 6,380,774 B2 | 4/2002 | Saeki | ................ | 327/119 |
| 6,385,126 B2 | 5/2002 | Jung et al. | ................ | 365/233 |
| 6,397,042 B1 | 5/2002 | Prentice et al. | ............ | 455/67.4 |
| 6,484,268 B2 | 11/2002 | Tamura et al. | ............. | 713/600 |
| 6,509,773 B2 | 1/2003 | Buchwald et al. | .......... | 327/248 |
| 6,513,103 B1 | 1/2003 | Garlepp et al. | ............. | 711/167 |
| 6,525,584 B2 | 2/2003 | Seo et al. | ................ | 327/276 |
| 6,707,727 B2 | 3/2004 | Tamura et al. | ............. | 365/192 |
| 6,791,360 B2 | 9/2004 | Gauthier et al. | .............. | 326/93 |
| 6,791,388 B2 | 9/2004 | Buchwald et al. | .......... | 327/248 |
| 6,794,912 B2 | 9/2004 | Hirata et al. | ................ | 327/158 |
| 6,815,986 B2 | 11/2004 | Roy et al. | .................. | 327/149 |
| 6,826,390 B1 | 11/2004 | Tamura | ................ | 455/226.1 |
| 6,854,002 B2 | 2/2005 | Conway et al. | ............ | 708/313 |
| 6,900,676 B1 | 5/2005 | Tamura | ..................... | 327/156 |
| 6,900,681 B2 | 5/2005 | Takano | ........................ | 327/175 |
| 6,922,372 B2 * | 7/2005 | Suzuki | ........................ | 365/233 |
| 6,943,606 B2 | 9/2005 | Dunning et al. | ............ | 327/231 |
| 6,947,510 B2 | 9/2005 | Dietl et al. | ................. | 375/354 |
| 2001/0007136 A1 | 7/2001 | Tamura et al. | ............. | 713/500 |
| 2002/0079938 A1 | 6/2002 | Saeki | ........................ | 327/165 |
| 2002/0080883 A1 | 6/2002 | Tamura et al. | ............. | 375/257 |
| 2002/0087820 A1 | 7/2002 | Garlepp et al. | ............. | 711/167 |
| 2002/0087922 A1 | 7/2002 | Glenn et al. | ................. | 714/700 |
| 2003/0038659 A1 | 2/2003 | Takahashi et al. | ......... | 327/141 |
| 2003/0043926 A1 | 3/2003 | Terashima et al. | ......... | 375/257 |
| 2003/0208713 A1 | 11/2003 | Evans | ........................ | 714/742 |

(Continued)

*Primary Examiner*—Richard T. Elms
*Assistant Examiner*—Nam Nguyen
(74) *Attorney, Agent, or Firm*—Dorsey & Whitney LLP

(57) ABSTRACT

The timing of output signals can be controlled by coupling a digital signal through a signal distribution tree having a plurality of branches extending from an input node to respective clock inputs of a plurality of latches. A phase interpolator is included in a signal path common to all of the branches, and a respective delay line is included in each of the branches. Each of the latches couples a signal applied to its data input to an output terminal responsive to a transition of the digital signal applied to its clock input. The delay lines are adjusted so that the latches are simultaneously clocked. The delay of the phase interpolator is adjusted so that the signals are coupled to the output terminals of the latches with a predetermined timing relationship relative to signals coupled to output terminals of a second signal distribution tree.

14 Claims, 8 Drawing Sheets

U.S. PATENT DOCUMENTS

| | | | |
|---|---|---|---|
| 2004/0013217 A1 | 1/2004 | Dietrich et al. | 375/372 |
| 2004/0022339 A1 | 2/2004 | Nakao | 375/376 |
| 2004/0052323 A1 | 3/2004 | Zhang | 375/375 |
| 2004/0066873 A1 | 4/2004 | Cho et al. | 375/376 |
| 2004/0168036 A1 | 8/2004 | Garlepp et al. | 711/167 |
| 2005/0024117 A1 | 2/2005 | Kubo et al. | 327/258 |
| 2005/0025252 A1 | 2/2005 | Tate et al. | 375/257 |
| 2005/0030110 A1 | 2/2005 | Yen | 331/45 |
| 2005/0047495 A1 | 3/2005 | Yoshioka | 375/219 |
| 2005/0134300 A1 | 6/2005 | Kushiyama et al. | 324/763 |
| 2005/0135527 A1 | 6/2005 | Masui et al. | 375/355 |
| 2005/0147194 A1 | 7/2005 | Koenenkamp | 375/348 |
| 2005/0190193 A1 | 9/2005 | Freker et al. | 345/534 |
| 2005/0193290 A1 | 9/2005 | Cho et al. | 714/710 |
| 2005/0201500 A1 | 9/2005 | Shizuki | 375/350 |
| 2005/0259504 A1 | 11/2005 | Murtugh et al. | 365/233 |

* cited by examiner

US 7,379,382 B2

SYSTEM AND METHOD FOR CONTROLLING TIMING OF OUTPUT SIGNALS

TECHNICAL FIELD

This invention relates to transmitting digital signals from electronic devices such as testers, memory devices, etc., and, more particularly, to a system and method for precisely controlling the timing at which a digital signals are output from the electronic devices.

BACKGROUND OF THE INVENTION

Digital signals are received and transmitted by many types of digital electronic devices at ever increasing rates. For example, the rate at which command, address and write data signals are applied to memory devices, such as dynamic random access memory ("DRAM") devices, continues to increase, as does the rate at which read data signals are output from memory devices. As the rate at which such signals are transmitted continues to increase, it has become more difficult to ensure that the signals are transmitted at the proper time and in synchronism with each other. For example, typical clock trees 10, 14 are shown in FIG. 1. The clock tree 10 couples a first internal clock signal $ICLK_1$ through a series of symmetrically connected buffers 18, which may be two-transistor inverters, to the clock inputs of a plurality of latches $20_{0,1\ldots N}$. Each of the latches $20_{0,1\ldots N}$ receives at its data input a respective data bit $D_{0,1\ldots N}$, and outputs a respective data signal $DQ_{0,1\ldots N}$, to a respective DQ terminal responsive to the rising edge of the clock signal applied to the its clock input. Insofar as all of the latches $20_{0,1\ldots N}$ are driven through the same clock tree 10, the DQ terminals are considered to be in the same "pin group."

The other clock tree 14 receives a second internal clock signal $ICLK_2$, and couples the $ICLK_2$ signal through buffers 22 to the clock inputs of respective latches 24a,b. The data inputs of the latches 24a,b are coupled to a logic "1" level. The latch 24a therefore outputs a high data strobe signal to the DQS terminal responsive to the rising edge of the $ICLK_2$ signal. This high at the output of the latch 24a also resets the latch 24b. The latch 24b receives the $ICLK_2$ signal through an odd number of buffers 22 so that it outputs a high complementary data strobe signal DQS* responsive to the falling edge of the $ICLK_2$ signal. The high at the output of the latch 24b also resets the latch 24a. The DQS and DQS* signals are considered to be in the same pin group, which is different from the DQ signal pin group.

The clock trees 10, 14 shown in FIG. 1 are typical of those used in, for example, memory controllers to output write data signals to memory devices, memory devices to output read data signals to a memory controller, or testing systems to output digital signals to devices under test. The data strobe signals DQS, DQS* are typically used in source synchronous applications to strobe data signals transmitted from the latches 20 at a receiving device. For example, in double data rate ("DDR") memory devices, the rising edge of the DQS signal is used by a serializing device to transmit a first set of data signals from the latches 20, and the rising edge of the DQS* signal is used to transmit a second set of data signals from the latches 20. At a receiving device, the rising edge of the DQS signal is used to latch the first set of data signals from the latches 20, and the rising edge of the DQS* signal is used to latch the second set of data signals from the latches 20. In such memory devices, the DQ signals can be considered one pin group, the address signals can be considered another pin set, and the command signals can be considered still another pin set, insofar as they are each triggered by an internal clock signal coupled through different clock trees.

As the speed at which data signals are transmitted continues to increase, it has become more difficult to ensure that the DQ signals are all transmitted at the same time, and that the DQS and DQS* signals have the proper timing relative to the DQ signals. With further reference to FIG. 1, one problem with ensuring that the DQ signals are all transmitted at the same time results from unequal lengths in the signal path from the node to which the $ICLK_1$ signal is applied to the clock inputs of the latches 20. The unequal path lengths can cause the $ICLK_1$ signal to be applied to the latches 20 at different times, thereby causing the latches 20 to output the DQ signals at different times.

It can also be seen from FIG. 1 that the number of buffers 18 through which the $ICLK_1$ signal propagates is different from the number of buffers 22 through which the $ICLK_2$ signal propagates. This difference can cause the transitions of the DQS and DQS* signals to occur before or after the DQ signals output by the latches 20 are valid. The propagation time differences can be compensated for to some extent by adding delay in the signal path of the $ICLK_2$ signal, such as by adding addition buffers. However, adding buffers that are to be used only for increasing delay takes up valuable space on a semiconductor die. Also, the propagation delays through the buffers 18, 22 generally can vary with process variations, supply voltage fluctuations, and temperature changes. Therefore, if the propagation delays of the $ICLK_1$ and $ICLK_2$ signals are equalized for one set of conditions, the propagation delays may no longer be equal for different processing runs of a device, for different supply voltages and/or for different temperatures. Alternatively, a smaller number of buffers 18 could be used in the clock tree 10, and each buffer 18 could be coupled to a larger number of latches 20. However, the buffers 18 would then be loaded to a greater extent than the loading of the buffers 22. As a result, the $ICLK_1$ signal coupled through the heavily loaded buffers 18 would be delayed to a greater extend than the delay of the $ICLK_2$ signal coupled through the lightly loaded buffers 22. As a result, the transitions of the DQS and DQS* signals might not occur at a time the DQ signals are valid.

While the number of buffers 22 through which the $ICLK_2$ signal propagates is different from the number of buffers 18 through which the $ICLK_1$ signal propagates, the number of buffers 18 through which the $ICLK_1$ signal propagates to reach each of the latches 20 is the same for all branches of the clock tree 10. Therefore, the timing at which the $ICLK_1$ signal reaches each of the latches 20 will theoretically be the same despite process, voltage and temperature variations. However, the lengths of the conductors through which the $ICLK_1$ signal must propagate to reach each of the latches 20 will generally not be the same. Furthermore, it is generally not possible to compensate for these different propagation times by, for example, inserting additional buffers in the signal path because the propagation times of the buffers, but not the propagation time of conductors, will generally vary with process, voltage and temperature variations.

The manner in which the propagation delay of the buffers 18, 22 vary with, for example, temperature is shown in the graph of FIG. 2, which also shows the relatively constant conductor or wire propagation delay. As shown in FIG. 2, the total propagation delay is the sum of the buffer or other semiconductor element delay and the wire delays. The slope and magnitude of the total propagation delay curve will vary with the relative contribution of the semiconductor element delays and the wire delays. In general, the delay curve will be steeper if the semiconductor element delays are a higher percentage of the total delay, and it will be shallower if the wire delays are a higher percentage of the total delay. The variation in both the slope and magnitude of the total propagation delay depending on the absolute and relative delay of the semiconductor element delays and the wire delays makes it very difficult to control the output times of digital signals both within each pin group and between different pin groups.

There is therefore a need for a system and method for ensuring that digital signals are transmitted from electronic devices, such as memory devices, memory controllers, testing systems and the like, with precisely controlled timing.

SUMMARY OF THE INVENTION

A system for controlling the timing at which a signal is transmitted includes a first signal distribution tree having a plurality of branches. A first digital input signal is applied to an input node of the tree and is coupled through the respective branches to a plurality of respective first output nodes. The first signal distribution tree further includes a phase interpolator through which the digital input signal is coupled between the input node and each of the first output nodes. At least one branch through which the input signal is coupled to at least one of the first output nodes includes a delay line coupled in series with the phase interpolator. A second signal distribution tree also has a plurality of branches. A second digital input signal is applied to an input node of the second signal distribution tree, and is coupled through the respective branches to a plurality of respective second output nodes. The second signal distribution tree also includes a delay line in at least one of its branches from the input node to a respective one of the second output nodes. The delay lines in the first signal distribution tree may be adjusted so that the input signal is coupled through the first signal distribution tree from the input node to each of the first output nodes at substantially the same time. Similarly, the delay lines in the second signal distribution tree may be adjusted so that the input signal is coupled through the second signal distribution tree from the input node to each of the second output nodes at substantially the same time. The delay of the phase interpolator may be adjusted to provide a predetermined timing relationship between the coupling of the input signal to the first output nodes and the coupling of the input signal to the second output nodes.

The first and second clock distribution trees may be used in a memory controller or memory device to control the timing of data signals coupled between the memory controller and memory device relative to each other as well as relative to the timing of a data strobe signal coupled between the memory controller and memory device.

The first and second clock distribution trees may also be used in an integrated circuit tester to apply test signals to an integrated circuit having a range of timing relationships relative to a strobe signal that is also applied to the integrated circuit being tested. The tester then receives results signals from the integrated circuit being tested, which indicate the performance of the integrated circuit to various timing relationships in the range.

DETAILED DESCRIPTION

Figure 1:
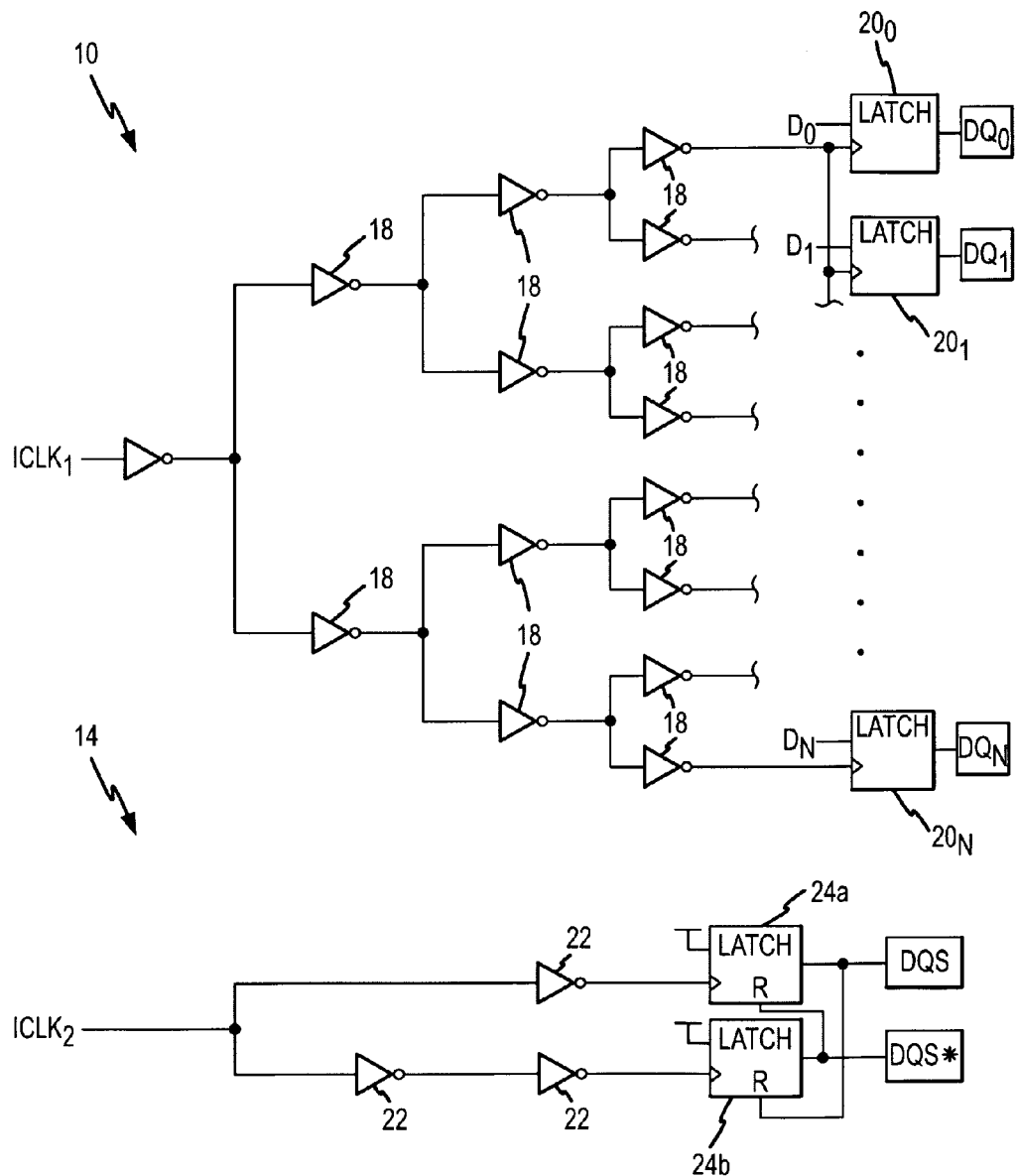
FIG. 1 is a logic diagram showing a pair of clock trees conventionally used to output digital signals in a variety of electronic devices.
Figure 2:
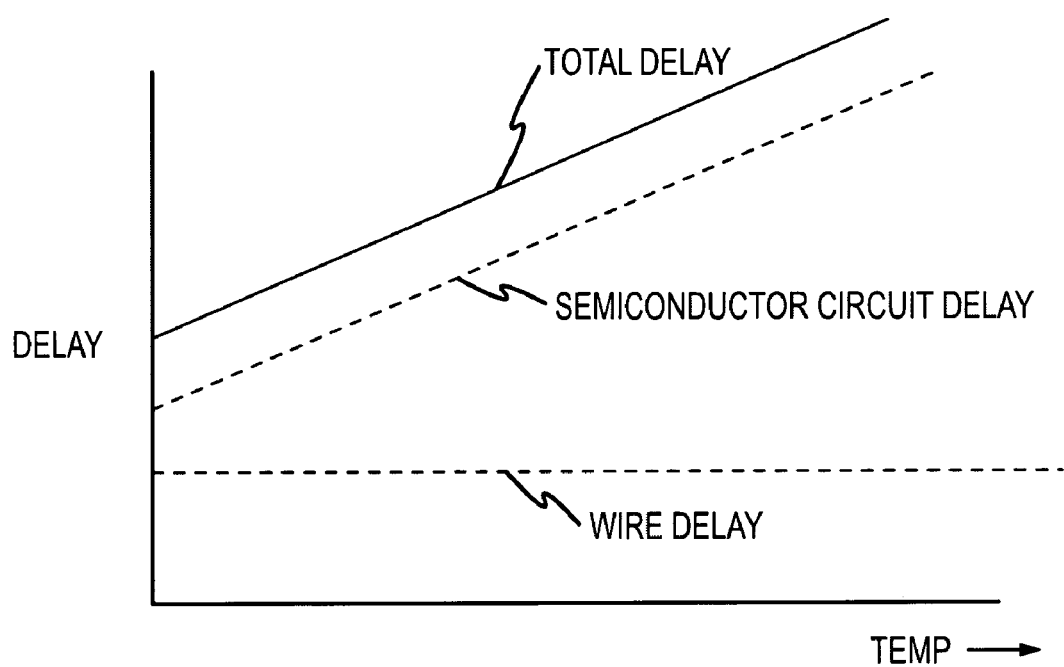
FIG. 2 is a graph showing the relationship between propagation delay and temperature in the clock trees of FIG. 1.
Figure 3:
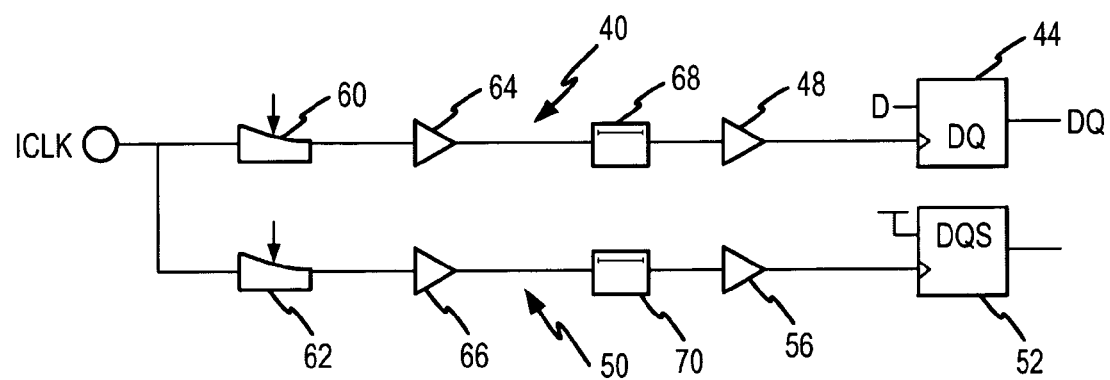
FIG. 3 is a logic diagram showing a clock tree according to one example of the invention for controlling the timing of DQ signals in one pin group relative to each other and to signals in a DQS pin group.

A system and method for controlling the output times of digital signals according to one example of the invention is shown in FIG. 3. An internal clock signal ICLK is coupled through a first clock tree 40 to the clock input of a large number of latches 44, although only one latch 44 and one branch of the tree 40 is shown in FIG. 3 in the interests of clarity. In the example of FIG. 3, the latches 44 each output a respective bit of a write data signal DQ. The tree 40 is considered to be heavily loaded in that the ICLK signal is coupled to the large number of latches 44 through a large number of branches, and hence a large number of buffers 48.

The ICLK signal is also coupled through a second clock tree 50 to a pair of latches, although only one latch 52 is shown for purposes of clarity. The second clock tree generates complementary DQS and DQS* signals. The tree 50 is considered to be lightly loaded because the ICLK signal is coupled to the latches 52 through only two branches, each containing a single buffer 56. As a result of the different loadings of the clock trees 40, 50, as well as differences in the number of buffers and lengths of conductors in the trees 40, 50, it is difficult to control the timing of the DQ signals relative to each other and to the DQS signal. According to one example of the invention, this difficulty is largely overcome by offsetting the phase of the ICLK signal using a respective phase interpolator 60, 62 in each of the trees 40, 50. As is well-known in the art, a phase interpolator is able to interpolate between the phase of two input signals by a precisely controlled amount. The phase interpolators 60, 62 each receive the ICLK signal and its complement ICLK*. The degree of precision of the delay of a signal generated by a phase interpolator depends on the precision of the input signal frequency. The phase interpolators 60, 62 can, for example, interpolate between the phases of the ICLK and ICLK* signals in 100 increments. If the ICLK and ICLK* signals have a frequency of 5 mHz, the phase offset of the signals output from the phase interpolators 60, 62 can then be adjusted in 1 nanosecond increments. The degree of precision of the delay depends on the precision of the input signal frequency, and is thus not adversely affected by process, supply voltage or temperature variations.

The outputs of the interpolators 60, 62 are coupled through branches of the respective clock trees 40, 50, each of which contains a buffer, although only one buffer 64, 66 is shown in each branch in FIG. 3. At least some of the branches in the clock trees 40, 50 contain respective delay lines 68, 70. As is well known in the art, the delay provided by the delay lines 68, 70 varies with process, supply voltage, and temperature variations. The delay provided by a delay line in one branch of a tree can therefore track semiconductor element delays in another branch of the same or a different tree.

In operation, the phase interpolators 64, 66 are adjusted to maintain a predetermined timing relationship between the signals in the DQ signal pin group and the signal in the DQS pin group. The phase interpolators 60, 62 primarily compensate for differences in the wire delays in the clock trees 40, 50. Like the wire delays, the delays of the phase interpolators 60, 62 are relatively insensitive to process, supply voltage or temperature variations. The delay lines 68, 70 primarily compensate for differences in the delays in each branch of the clock trees 40, 50 so that the DQ signals all transition at the same time, and both of the DQS signals transition at the same time. The delay lines 68, 70 are sensitive to process, supply voltage or temperature variations, and they roughly therefore track propagation delay variations of the buffers 48, 56, 64, 66 and other semiconductor circuit elements resulting from those same factors.

Figure 4:
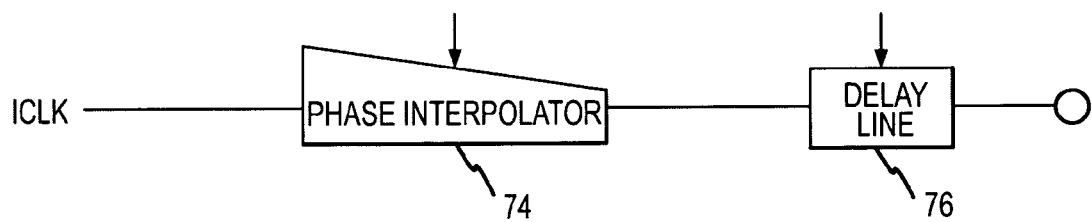
FIG. 4 is a clock signal path according to another example of the invention that can be used to generate a delay that varies in a selected manner as a function of process, supply voltage and temperature variations.
Figure 5:
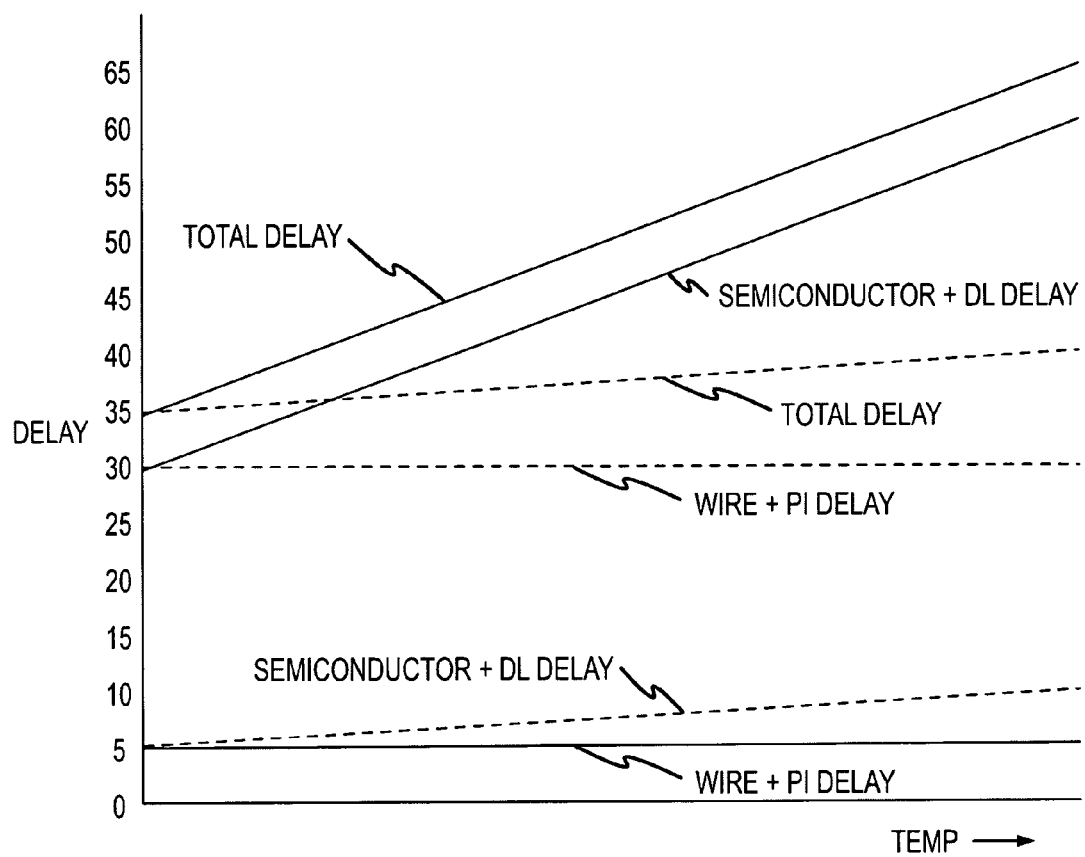
FIG. 5 is a graph showing two examples of delay functions that can be achieved using the clock signal path of FIG. 4.

Another advantage to placing a delay line in series with a phase interpolator in the clock trees is that it is possible to control the slope and magnitude of the delay as a function of processing, supply voltage, and temperature variations. For example, with reference to FIG. 4, an ICLK signal is applied to the series combination of a phase interpolator 74 and a delay line 76, each of which provides a controllable delay. As mentioned above, the phase interpolator 74 is relatively insensitive to process, voltage and temperature variations. On the other hand, the delay line 76 is sensitive to process, voltage and temperature variations. In a first example shown in FIG. 5, the delay of the delay line 76 (and any semiconductor circuit element in series with the delay line 76) is 5 ns at a relatively low temperature and doubles with temperature to 10 ns. In this example, the combined delay of the wire delay and phase interpolator 74 is a constant 30 ns. The total delay therefore starts at 35 ns and increases with temperature to 40 ns. In a second example shown in FIG. 5 as a solid line, the delay of the delay line 76 is 30 ns at a relatively low temperature and again doubles with temperature to 60 ns. In this example, the delay of the wire delay and phase interpolator 74 is a constant 5 ns. The total delay therefore starts at 35 ns and increases with temperature to 65 ns. Therefore, the slope of the total delay in the second example is substantially greater than the slope of the total delay in the first example. By combining the phase interpolator 74 in series with the delay line 76 in this manner, a delay vs. temperature relationship having virtually any magnitude and slope can be created.

The system and method for controlling the timing at which digital signals are output can also be used to test the timing margins of digital circuits, such as memory devices. For example, two memory device timing parameters that are normally tested are the maximum data set-up time, which is abbreviated as $t_{DS}$, and the minimum data hold time, which is abbreviated as $t_{DH}$. As mentioned above, in source synchronous data transfers, write data signals DQ are transmitted in synchronism with a data strobe signal DQS. The maximum time needed for the write data signals DQ to become valid after the transition of DQS, i.e., the data set up time $t_{DS}$, is normally specified for a memory device. Similarly, the minimum time that the write data signals DQ must remain valid after the transition of DQS, i.e., the data hold time $t_{DH}$, is also normally specified for a memory device.

The time between $t_{DS}$ and $t_{DH}$ is the data valid period. The length of the data valid period may be excessively reduced by any increase in the set-up time beyond the specified maximum set-up time $t_{DS}$ or any decrease of the data hold time from the specified minimum data hold time $t_{DH}$. As the length of the data hold period gets smaller, it becomes more difficult for the memory device to position transitions of the DQS signal in the data valid period. It is therefore important to determine the data set-up and data hold times of a memory device being tested to ensure that a sufficient data valid period can be achieved.

Figure 6:
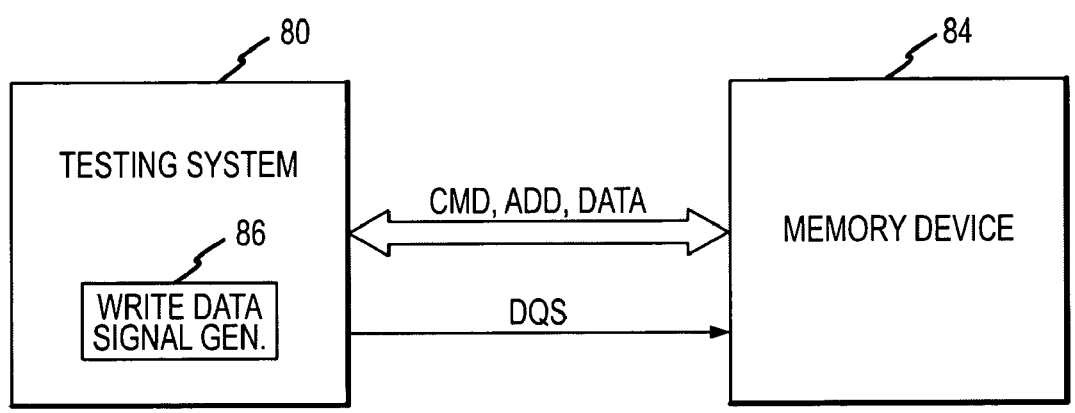
FIG. 6 is a block diagram of a testing system according to one example of the invention being used to test a memory device.

A memory device can be tested to determine the values of $t_{DS}$ and $T_{DH}$, as well as other timing parameters, by varying the timing relationship between the write data signals DQ and the data strobe signal DQS, and determining which relationships allow the DQ signals to be written to the memory device. For example, with reference to FIG. 6, a testing system 80 is coupled to a device under test, which, in this example, is a memory device 84, such as a DRAM device. The testing system 80 generates and provides to the memory device 84 memory commands, memory addresses, and write data, and it receives read data from the memory device 84. The testing system 80 also generates and provides to the memory device 84 a data strobe DQS signal. The testing system 80 also includes circuitry 86 for providing write data signals with precisely controlled timing. Also included in the testing system 80 is extensive circuitry of conventional design, which is not shown and will not be explained for purposes of brevity and clarity.

Figure 7:
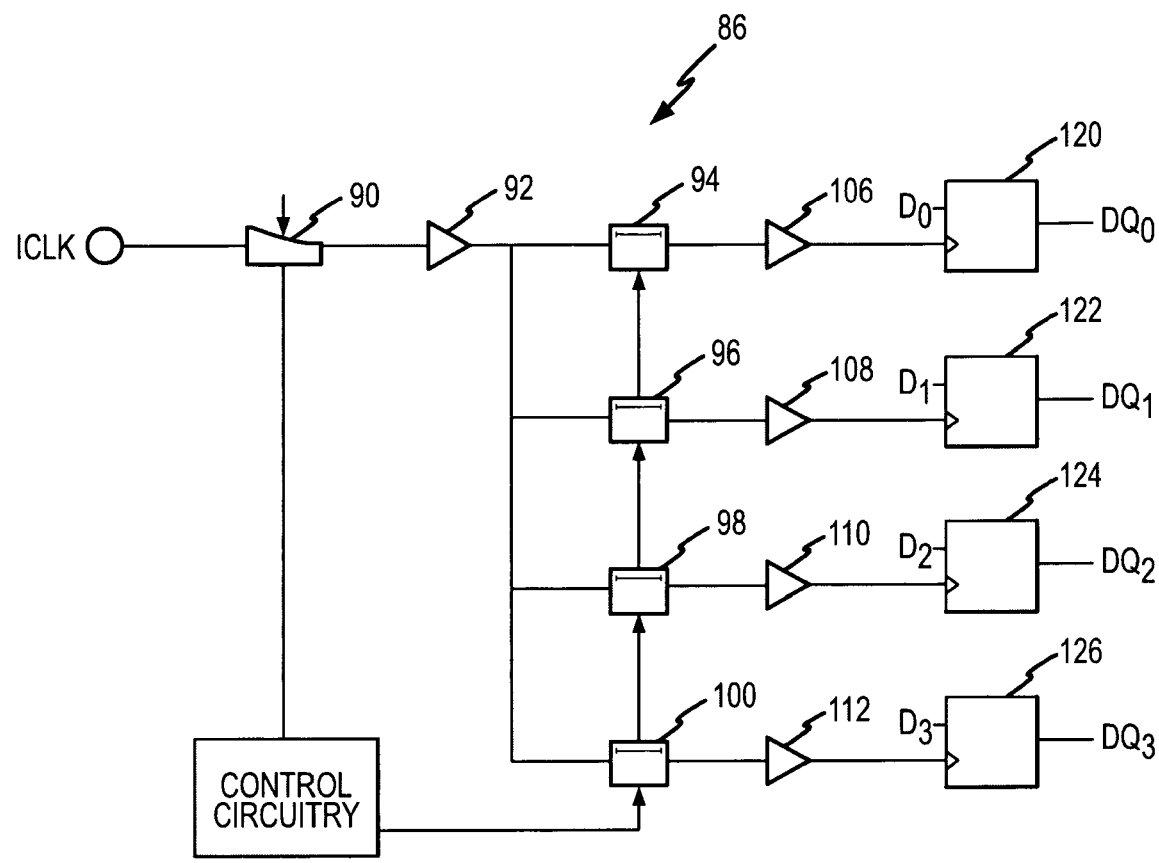
FIG. 7 is a logic diagram of one example of a write data signal generator that may be used in the testing system of FIG. 6.

One example of the write data signal generating circuitry 86 is shown in FIG. 7. The circuitry 86 includes a phase interpolator 90, which receives and delays an ICLK signal by a selected delay amount. The delayed ICLK signal is then distributed through a clock tree represented by a buffer 92 to four delay lines 94, 96, 98, 100. The delay provided by each of the delay lines 94-100 can be precisely controlled. The outputs of the delay lines 94-100 are applied through respective buffers 106, 108, 100, 112 to the clock inputs of respective latches 120, 122, 124, 126, each of which receive a respective data signal at their data input. The latches 120-126 output four write data signals DQ. The delays of the phase interpolator 90 and the delay lines 94-100 are controlled by a control circuitry 128.

In operation, the delay lines 94-100 are adjusted so that the DQ signals are output from all of the latches 120-126 at the same time. The phase interpolator 90 is then adjusted to vary the delay time of the phase interpolator 90 over a range of delay values. The timing of a data strobe signal DQS (FIG. 6) is maintained constant so that the timing relationship between the DQ signals and the DQS signal is varied. As each delay value, the ability of a memory device to capture the DQ signals is tested, such as by conducting a read after each attempted write. The timing margins of the memory devices, such as the maximum set-up time $t_{DS}$ and the data hold time $t_{DH}$, can then be determined.

Figure 8:
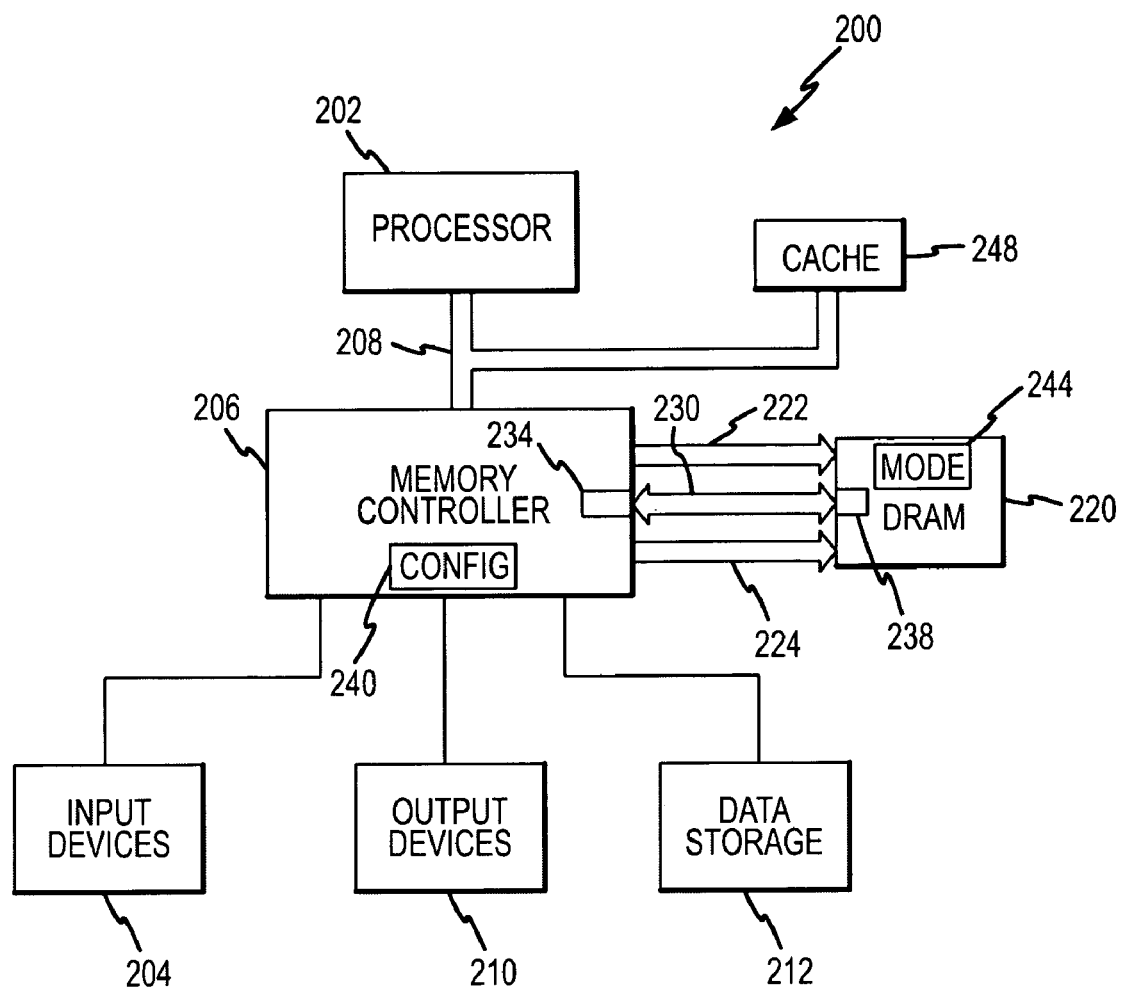
FIG. 8 is a block diagram of a computer system having a memory controller and a memory device, both of which use a data signal generator according to one example of the invention.

As mentioned above, the system and method for controlling the output times of digital signals shown in FIG. 3 can be used to output write data signals from a memory controller and to output read data signals from a memory device, such as a DRAM device. With reference to FIG. 8, a computer system 200 is shown that can take advantage of various examples of the present invention. The computer system 200 includes a processor 202 for performing various functions, such as performing specific calculations or tasks. In addition, the computer system 200 includes one or more input devices 204, such as a keyboard or a mouse, coupled to the processor 202 through a memory controller 206 and a processor bus 208 to allow an operator to interface with the computer system 200. Typically, the computer system 200 also includes one or more output devices 210 coupled to the processor 202, such output devices typically being a printer or a video terminal. One or more data storage devices 212 are also typically coupled to the processor 202 through the memory controller 206 to store data or retrieve data from external storage media (not shown). Examples of typical data storage devices 212 include hard and floppy disks, tape cassettes, and compact disk read-only memories (CD-ROMs).

The computer system 200 also includes a DRAM device 220 that is coupled to the memory controller 206 through a control bus 222, an address bus 224 and a data bus 230. The memory controller 206 includes a write data output circuit 234 similar to the circuit shown in FIG. 3. The write data output circuit 234 is operable to apply write data signals and at least one write signal to the data bus 230 at precisely controlled times. Similarly, the DRAM device 220 also includes a read data output circuit 238 that is operable to apply read data signals and at least one read strobe signal to the data bus 230 at precisely controlled times. For this reason, the DRAM device 220 and memory controller 206 are able to operate at very high speeds without the need to design either the memory controller 206 or the DRAM device 220 with precisely controlled signal propagation times. A configuration register 240 in the memory controller 206 and a mode register 244 in the DRAM device 220 may be programmed to select the delays of the phase interpolators and delay lines used in the write data output circuit 234 and the read data output circuit 238, respectively. The computer system 200 may also include a cache memory 248 coupled to the processor 202 through the processor bus 208 to provide for the rapid storage and reading of data and/or instructions, as is well known in the art.

Although the present invention has been described with reference to the disclosed examples, persons skilled in the art will recognize that changes may be made in form and detail without departing from the spirit and scope of the invention. For example, although clock trees using various examples of the present invention generally have a phase interpolator in each tree and a delay line in each branch, it will be understood that it may be possible to omit a phase interpolator in one or more clock trees and use a phase interpolator in another tree to match the timing in the clock tree with the omitted phase interpolator. Similarly, it may be possible to omit a delay line in one or more branch of a clock tree and use a delay line in another branch to match the timing in the branch with the omitted delay line. Such modifications are well within the skill of those ordinarily skilled in the art. Accordingly, the invention is not limited except as by the appended claims.

I claim:

1. A memory device, comprising:
    a memory array operable to store write data responsive to a write command at a location corresponding to an address applied to the memory device, the memory array being operable to output read data responsive to a read command from a location corresponding to an address applied to the memory device; and
    a read data output circuit coupled to receive the read data from the memory array, the read data output circuit comprising:
        a plurality of data latches, each of the data latches having a clock input, a data input, and an output on which a respective read data signal is transmitted from the memory device, each of the data latches being operable to receive at its data input a respective bit of the read data from the memory array;
        a signal distribution tree having an input node coupled to receive a first digital signal and a plurality of output nodes each of which is coupled to the clock input of a respective one of the data latches;
        a phase interpolator in a signal path of the signal distribution tree between the input node and each of the output nodes; and
        a delay line in at least one signal path of the signal distribution tree between the input node and at least one of the output nodes.

2. The memory device of claim 1 wherein the memory array comprises a dynamic random access memory array.

3. The memory device of claim 1 wherein the read data output circuit further comprises:
    a read data strobe signal path having an input node coupled to receive a read data strobe signal and a read data strobe output terminal from which the read data strobe signal is transmitted from the memory device; and
    at least one delay line in at least one signal path of the read data strobe signal path.

4. The memory device of claim 3, further comprising a second phase interpolator in the data strobe signal path in series with the delay line.

5. The memory device of claim 4 wherein the delay of the first and second phase interpolators are selected to provide a predetermined relationship between the timing of the read data signals transmitted from the memory device relative to the timing of the read data strobe signal transmitted from the memory device.

6. The memory device of claim 1 wherein at least one delay line is in each signal path of the signal distribution tree between the input node and at least one of the output nodes, the delays of the delay lines being selected so that the first digital signal is coupled to each of the output nodes at substantially the same time.

7. The memory device of claim 1 wherein the read data output circuit further comprises:
    first and second data strobe latches, each of the data strobe latches having a clock input and a data input, each of the data strobe latches being operable to receive at its data input a predetermined logic level, each of the first and second data strobe latches further having a data strobe output;
    and wherein the read data strobe signal path further comprises a signal distribution tree having an input node coupled to receive the read data strobe signal and first and second output nodes coupled to the clock inputs of the first and second data strobe latches, respectively, the read data strobe signal path from the input node to the first output node having an odd number of inverter circuits, and the read data strobe signal path from the input node to the second output node having an even number of inverter circuits, the at least one delay line being in at least one of the read data strobe signal paths.

8. The memory device of claim 7, further comprising a second phase interpolator in at least one of the read data strobe signal paths.

9. A processor-based system, comprising:
a processor having a processor bus;
an input device coupled to the processor through the processor bus adapted to allow data to be entered into the computer system;
an output device coupled to the processor through the processor bus adapted to allow data to be output from the computer system;
a memory controller, comprising:
   memory controller circuitry operable to transmit memory command and address signals and to receive read data signals; and
   a write data output circuit operable to transmit write data signals, the write data output circuit comprising:
      a plurality of write data latches, each of the write data latches having a clock input, a write data input, and a write data output, each of the write data latches being operable to receive at its write data input a respective bit of write data from a memory access device;
      a signal distribution tree having an input node coupled to receive a first digital signal and a plurality of output nodes each of which is coupled to the clock input of a respective one of the write data latches;
      a phase interpolator in a signal path of the signal distribution tree between the input node and each of the output nodes; and
      a delay line in at least one signal path of the signal distribution tree between the input node and at least one of the output nodes; and
a memory device coupled to the memory controller, including the write data outputs of the write data latches, the memory device comprising:
   a memory array operable to store write data responsive to a write command transmitted to the memory device from the memory controller and at a location corresponding to an address transmitted to the memory device from the memory controller, the memory array being operable to output read data responsive to a read command transmitted to the memory device from the memory controller, the read data being output from a location in the memory array corresponding to an address transmitted to the memory device from the memory controller; and
   a read data output circuit coupled to receive the read data from the memory array, the read data output circuit comprising:
      a plurality of read data latches, each of the read data latches having a clock input, a read data input, and a read data output coupled to the memory controller, each of the read data latches being operable to receive at its read data input a respective bit of the read data from the memory array;
      a signal distribution tree having an input node coupled to receive a second digital signal and a plurality of output nodes each of which is coupled to the clock input of a respective one of the read data latches;
      a phase interpolator in a signal path of the signal distribution tree between the input node and each of the output nodes; and
      a delay line in at least one signal path of the signal distribution tree between the input node and at least one of the output nodes.

10. The processor-based system of claim 9 wherein the memory device comprises a dynamic random access memory device.

11. The processor-based system of claim 9 wherein the read data output circuit further comprises:
   a read data strobe signal path having an input node coupled to receive a read data strobe signal and a read data strobe output terminal coupled to the memory controller; and
   at least one delay line in at least one signal path of the read data strobe signal path.

12. The processor-based system of claim 11, further comprising a second phase interpolator in the read data strobe signal path in series with the delay line.

13. The processor-based system of claim 9 wherein the write data output circuit further comprises:
   a write data strobe signal path having an input node coupled to receive a write data strobe signal and a write data strobe output terminal coupled to the memory device; and
   at least one delay line in at least one signal path of the write data strobe signal path.

14. The processor-based system of claim 13, further comprising a second phase interpolator in the write data strobe signal path in series with the delay line.

* * * * *